US012690129B2

(12) United States Patent
Matsui et al.

(10) Patent No.: US 12,690,129 B2
(45) Date of Patent: Jul. 21, 2026

(54) WIRING CIRCUIT BOARD

(71) Applicant: NITTO DENKO CORPORATION, Osaka (JP)

(72) Inventors: Hideki Matsui, Osaka (JP); Naoki Shibata, Osaka (JP); Ryosuke Sasaoka, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 189 days.

(21) Appl. No.: 18/504,717

(22) Filed: Nov. 8, 2023

(65) Prior Publication Data

US 2024/0164017 A1 May 16, 2024

(30) Foreign Application Priority Data

Nov. 15, 2022 (JP) ................................. 2022-182954

(51) Int. Cl.
| | |
|---|---|
| *H05K 1/11* | (2006.01) |
| *H05K 3/10* | (2006.01) |
| *H05K 3/18* | (2006.01) |
| *H05K 3/38* | (2006.01) |
| H05K 3/24 | (2006.01) |

(52) U.S. Cl.
CPC .............. *H05K 1/11* (2013.01); *H05K 3/108* (2013.01); *H05K 3/18* (2013.01); *H05K 3/38* (2013.01); *H05K 3/244* (2013.01); *H05K 2201/0347* (2013.01); *H05K 2201/099* (2013.01); *H05K 2203/072* (2013.01); *H05K 2203/0723* (2013.01)

(58) Field of Classification Search
CPC . H05K 1/11; H05K 3/108; H05K 3/18; H05K 3/38; H05K 3/244; H05K 2201/0347; H05K 2201/099; H05K 2203/072; H05K 2203/0723; H05K 3/44; H05K 2201/0338; H05K 1/056; H05K 3/4007; H05K 1/02; H05K 3/28; H05K 3/40; H05K 1/05; H05K 1/181
See application file for complete search history.

(56) References Cited

U.S. PATENT DOCUMENTS

| | | | |
|---|---|---|---|
| 2006/0220246 A1* | 10/2006 | Kim | ................. H01L 23/49816 257/738 |
| 2008/0217048 A1 | 9/2008 | Kamei et al. | |
| 2022/0256712 A1* | 8/2022 | Takimoto | ............... H05K 1/118 |
| 2023/0098947 A1* | 3/2023 | Shibata | .................. H05K 1/111 174/250 |

FOREIGN PATENT DOCUMENTS

| | | |
|---|---|---|
| JP | 2006-229155 A | 8/2006 |
| JP | 2008-218728 A | 9/2008 |
| JP | 2022-111045 A | 7/2022 |

* cited by examiner

*Primary Examiner* — Timothy J Thompson
(74) *Attorney, Agent, or Firm* — Edwards Neils LLC; Jean C. Edwards, Esq.

(57) ABSTRACT

A wiring circuit board includes a first insulating layer, a conductive pattern disposed at one side of the first insulating layer in a thickness direction and having a terminal and a wire connected with the terminal, and a second insulating layer for suppressing release of the terminal from the first insulating layer. The second insulating layer has a first portion disposed at the one side of the first insulating layer in the thickness direction and a second portion disposed at one side of a peripheral edge portion of the terminal in the thickness direction and covering the peripheral edge portion.

9 Claims, 8 Drawing Sheets

1

1

First direction

1

1

WIRING CIRCUIT BOARD

CROSS-REFERENCE TO RELATED APPLICATION

The present application claims priority from Japanese Patent Application No. 2022-182954 filed on Nov. 15, 2022, the contents of which are hereby incorporated by reference into this application.

TECHNICAL FIELD

The present invention relates to a wiring circuit board.

BACKGROUND ART

There has been a known wiring circuit board including a base insulating layer, a conductive layer having a terminal portion and a wiring portion, and a cover insulating layer covering the wiring portion (for example, see Patent Document 1 below).

CITATION LIST

Patent Document

Patent Document 1: Japanese Unexamined Patent Publication No. 2022-111045

SUMMARY OF THE INVENTION

Problem to be Solved by the Invention

There is a demand that the release of the terminal portion from the insulating base layer be suppressed in a wiring circuit board as described in Patent Document 1.

The present invention provides a wiring circuit board in which the release of the terminal portion from the first insulating layer is suppressed.

Means for Solving the Problem

The present invention [1] includes a wiring circuit board including: a first insulating layer; a conductive pattern disposed at one side of the first insulating layer in a thickness direction and having a terminal and a wire connected with the terminal; and a second insulating layer for suppressing release of the terminal from the first insulating layer, the second insulating layer having a first portion disposed at the one side of the first insulating layer in the thickness direction and a second portion disposed at the one side of a peripheral edge portion of the terminal in the thickness direction and covering the peripheral edge portion.

In the structure described above, the second portion of the second insulating layer covers the peripheral edge portion of the terminal.

Thus, the release of the terminal from the first insulating layer can be suppressed with the second portion of the second insulating layer.

The present invention [2] includes the wiring circuit board described in the above-described [1], wherein the terminal includes: a first conductive layer disposed at the one side of the first insulating layer in the thickness direction; and a second conductive layer made of a material identical to a material of the first conductive layer and disposed at the one side of the first insulating layer in the thickness direction.

In the structure described above, the terminal is made of a plurality of conductive layers (the first conductive layer and the second conductive layer). This makes the terminal thick and heavy as compared with a structure in which the terminal is made of one conductive layer.

Thus, the terminal may easily be released from the first insulating layer as compared with a structure in which the terminal is made of one conductive layer.

In light of the above point, covering the peripheral edge portion of the terminal with the second portion of the second insulating layer can suppress the release of the terminal from the first insulating layer even when the terminal is made of a plurality of conductive layers.

The present invention [3] includes the wiring circuit board described in the above-described [2], wherein the first conductive layer has the peripheral edge portion, wherein the peripheral edge portion is disposed outside an edge of the second conductive layer in a direction orthogonal to the thickness direction, and wherein the second portion of the second insulating layer does not cover the second conductive layer, but covers the peripheral edge portion of the first conductive layer.

In the structure as described above, while the terminal is easily connected to an electronic appliance at the second conductive layer that is not covered with the second insulating layer, the release of the terminal from the first insulating layer is suppressed by covering the peripheral edge portion of the first conductive layer with the second insulating layer.

The present invention [4] includes the wiring circuit board described in the above-described [2], wherein the second conductive layer has the peripheral edge portion, wherein the peripheral edge portion is disposed outside an edge of the first conductive layer in a direction orthogonal to the thickness direction, and wherein the second portion of the second insulating layer covers the peripheral edge portion of the second conductive layer.

In the structure as described above, the second conductive layer disposed at the one side of the first conductive layer forms the peripheral edge portion of the terminal.

This formation enables the second conductive layer to cover the first conductive layer and further the second insulating layer to cover the peripheral edge portion of the second conductive layer.

As a result, not only the release of the terminal from the first insulating layer but also the release of the second conductive layer from the first conductive layer can be suppressed.

The present invention [5] includes the wiring circuit board described in any one of the above-described [2] to [4], wherein the terminal protrudes toward the one side in the thickness direction as compared with the second insulating layer.

In the structure as described above, while the release of the terminal from the first insulating layer can be suppressed, the terminal is easily connected to an electronic appliance.

The present invention [6] includes the wiring circuit board described in any one of the above-described [2] to [5], wherein the second conductive layer is thicker than the first conductive layer.

In the structure as described above, the second conductive layer can secure a thickness of the terminal.

The present invention [7] includes the wiring circuit board described in any one of the above-described [1] to [6], wherein the second portion of the second insulating layer covers the peripheral edge portion on an entire periphery of the terminal.

In the structure as described above, the release of the terminal from the first insulating layer can further be suppressed.

The present invention [8] includes the wiring circuit board described in any one of the above-described [1] to [7], wherein the peripheral edge portion has: a first peripheral edge portion connected with the wire; and a second peripheral edge portion disposed at a side opposite to the wire relative to the first peripheral edge portion in a first direction orthogonal to the thickness direction, and wherein the second portion of the second insulating layer does not cover the first peripheral edge portion, but covers the second peripheral edge portion.

In the structure as described above, the release of the terminal from the first insulating layer can efficiently be suppressed with a small second insulating layer.

The present invention [9] includes the wiring circuit board described in any one of the above-described [1] to [8], further including a metal supporting layer disposed at the other side of the first insulating layer in the thickness direction.

In the structure as described above, the metal supporting layer can secure a stiffness of the wiring circuit board.

Effects of the Invention

In the wiring circuit board of the present invention, the release of the terminal from the first insulating layer can be suppressed.

BRIEF DESCRIPTION OF THE DRAWINGS

FIG. 3A illustrates a step of preparing a metal supporting layer. FIG. 3B illustrates a step of forming a first insulating layer. FIG. 3C illustrates a step of forming a first conductive layer. FIG. 3D illustrates a step of forming a second conductive layer. FIG. 3E illustrates a step of forming a second insulating layer.

DESCRIPTION OF THE EMBODIMENT

1. Wiring Circuit Board

Figure 1:
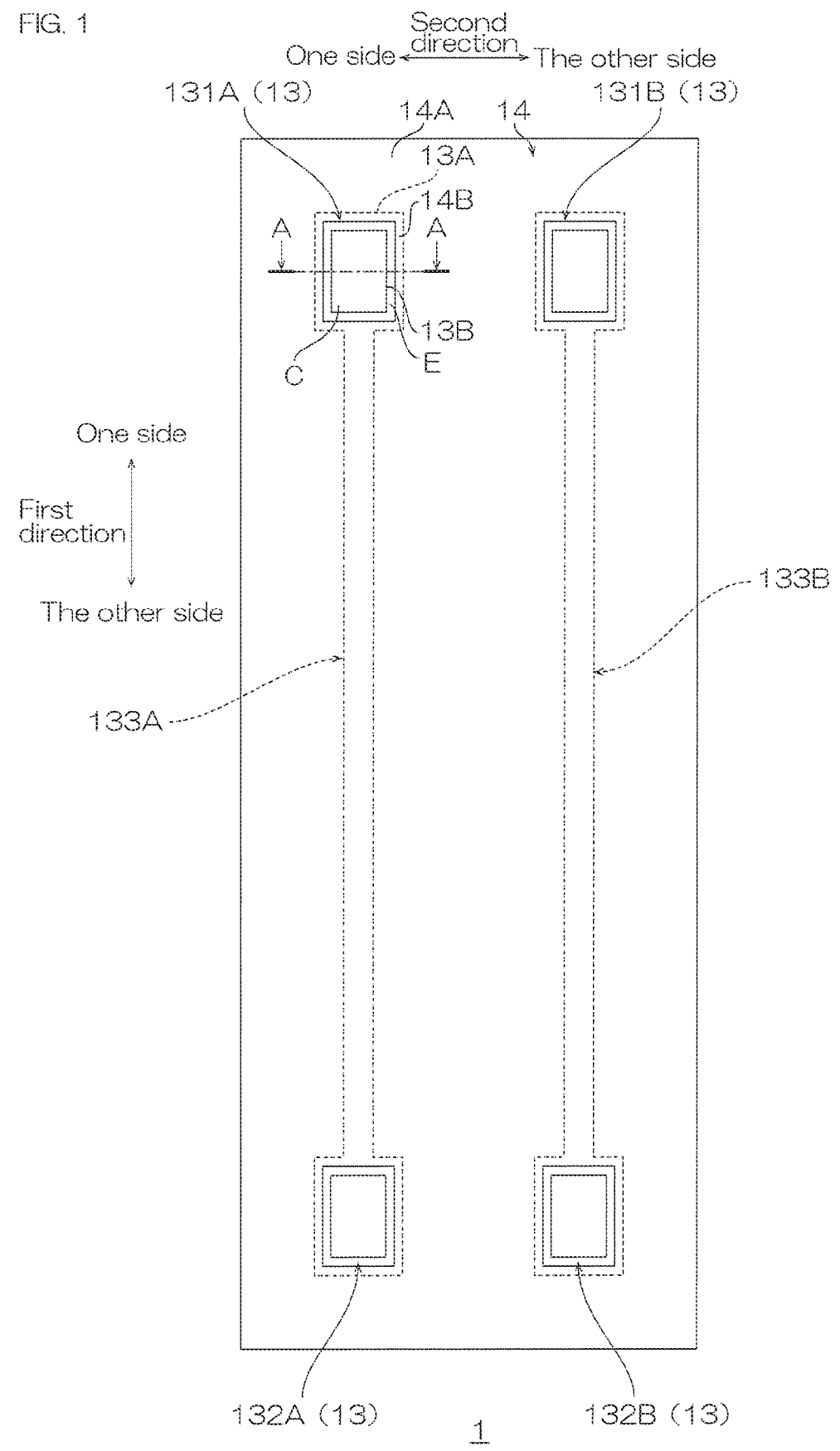
FIG. 1 is a plan view of a wiring circuit board as one embodiment of the present invention.

As illustrated in FIG. 1, a wiring circuit board 1 extends in a first direction and a second direction. The first direction is orthogonal to a thickness direction of the wiring circuit board 1. The second direction is orthogonal to the thickness direction of the wiring circuit board 1 and the first direction. In the present embodiment, the wiring circuit board 1 has an approximately rectangular shape. The shape of the wiring circuit board 1 is not limited.

Figure 2:
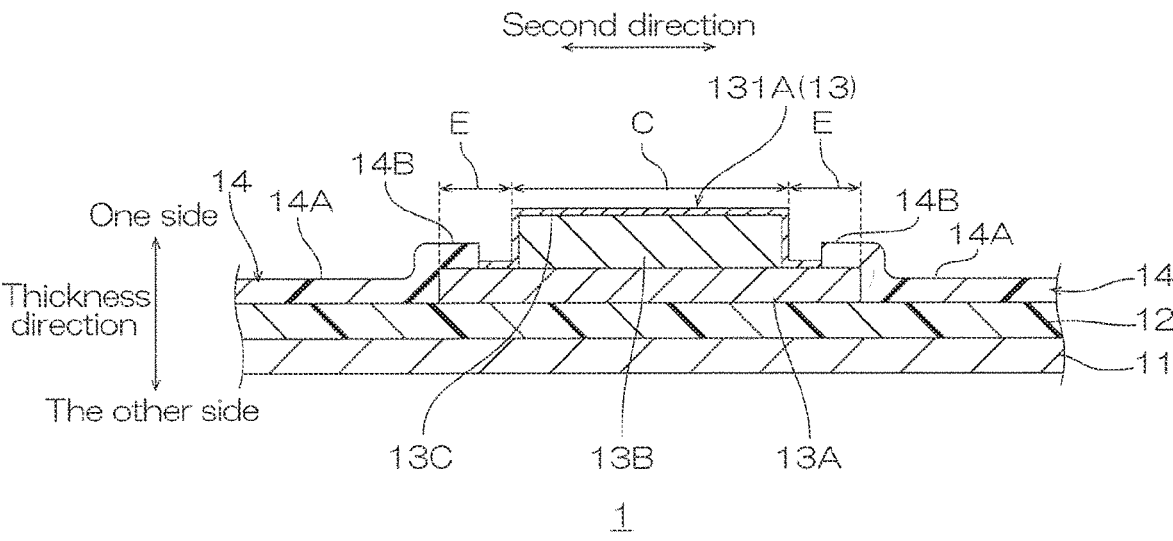
FIG. 2 is a cross-sectional view of the wiring circuit board, taken along line A-A of FIG. 1.

As illustrated in FIG. 2, the wiring circuit board 1 includes a metal supporting layer 11, a first insulating layer 12, a conductive pattern 13, and a second insulating layer 14.

(1) Metal Supporting Layer

The metal supporting layer 11 supports the first insulating layer 12, the conductive pattern 13, and the second insulating layer 14. The metal supporting layer 11 is disposed at the other side of the first insulating layer 12 in the thickness direction of the wiring circuit board 1. In the present embodiment, examples of the material of the metal supporting layer 11 include a stainless steel and a copper alloy.

(2) First Insulating Layer

The first insulating layer 12 is disposed at one side of the metal supporting layer 11 in the thickness direction. The first insulating layer 12 is disposed on the metal supporting layer 11. The first insulating layer 12 is disposed between the metal supporting layer 11 and the conductive pattern 13. The first insulating layer 12 insulates the metal supporting layer 11 from the conductive pattern 13. The first insulating layer 12 is made of resin. Examples of the resin include polyimide, maleimide, epoxy resin, polybenzoxazole, and polyester.

(3) Conductive Pattern

The conductive pattern 13 is disposed at one side of the first insulating layer 12 in the thickness direction. The conductive pattern 13 is disposed on the first insulating layer 12. The shape of the conductive pattern 13 is not limited.

In the present embodiment, as illustrated in FIG. 1, the conductive pattern 13 includes a plurality of terminals 131A and 131B, a plurality of terminals 132A and 132B, and a plurality of wires 133A and 133B.

(3-1) Terminals

The terminals 131A and 131B are disposed in one edge portion of the wiring circuit board 1 in the first direction. The terminals 131A and 131B are arranged in the second direction, separated from each other by an interval. Each of the terminals 131A and 131B has a square land shape extending in the first direction and the second direction. The shape of each of the terminals 131A and 131B is not limited. Each of the terminals 131A and 131B may be circular. The terminal 131A has a connecting portion C and a peripheral edge portion E.

The connecting portion C is a portion used for the connection between an electronic appliance and the terminal 131A. The connecting portion C is disposed in the central part of the terminal 131A in the first direction and the second direction.

The peripheral edge portion E is disposed in both end portions of the terminal 131A in the first direction and both end portions of the terminal 131A in the second direction. The peripheral edge portion E surrounds the connecting portion C.

Further, as illustrated in FIG. 2, the terminal 131A protrudes toward one side in the thickness direction as compared with the second insulating layer 14. In detail, the terminal 131A includes a first conductive layer 13A, a second conductive layer 13B, and a protective layer 13C. In other words, the conductive pattern 13 includes the first conductive layer 13A, the second conductive layer 13B, and the protective layer 13C.

The first conductive layer 13A is disposed on the first insulating layer 12 in the thickness direction. The first conductive layer 13A extends in the first direction and the second direction. The first conductive layer 13A is disposed across the connecting portion C and the peripheral edge portion E. In other words, the first conductive layer 13A has the peripheral edge portion E. The first conductive layer 13A is made of a metal. Examples of the metal include copper, silver, gold, iron, aluminum, chromium, and alloys thereof. In view of obtaining good electrical properties, copper is preferable.

The second conductive layer 13B is disposed on the first conductive layer 13A in the thickness direction. The second conductive layer 13B extends in the first direction and the second direction. The second conductive layer 13B is disposed in the connecting portion C. In the present embodiment, the second conductive layer 13B is not disposed in the peripheral edge portion E. In other words, the peripheral edge portion E is disposed outside the edge of the second conductive layer 13B in the first direction and the second direction. The second conductive layer 13B is made of a material identical to a material of the first conductive layer 13A. The second conductive layer 13B is thicker than the first conductive layer 13A.

The protective layer 13C covers the portion of the terminal 131A exposed from the second insulating layer 14. Specifically, the protective layer 13C covers a surface of the second conductive layer 13B. The protective layer 13C may cover a part of the surface of the first conductive layer 13A. The protective layer 13C suppresses the corrosion of the terminal 131A. The protective layer 13C is made of a metal different from those of the first conductive layer 13A and the second conductive layer 13B. Examples of the metal of the protective layer 13C include nickel, gold, and tin. The protective layer 13C preferably is made of gold.

The description of the terminal 131B is the same as that of the terminal 131A. Thus, the description of the terminal 131B is omitted.

As illustrated in FIG. 1, the terminals 132A and 132B are disposed in the other edge portion of the wiring circuit board 1 in the first direction. The terminals 132A and 132B are arranged in the second direction, separated from each other by an interval.

The description of each of the terminals 132A and 132B is also the same as that of the terminal 131A. Thus, the descriptions of the terminals 132A and 132B are omitted as well.

(3-2) Wires

The wire 133A electrically connects the terminal 131A with the terminal 132A. One end of the wire 133A is connected to the first conductive layer 13A of the terminal 131A. The other end of the wire 133A is connected to the first conductive layer 13A of the terminal 132A. The wire 133A is made of the same material as that of the first conductive layer 13A.

The wire 133B electrically connects the terminal 131B with the terminal 132B. One end of the wire 133B is connected to a first conductive layer 13A of the terminal 131B. The other end of the wire 133B is connected to a first conductive layer 13A of the terminal 132B. The wire 133B is made of the same material of that of the first conductive layer 13A.

(4) Second Insulating Layer

As illustrated in FIG. 2, the second insulating layer 14 suppresses the release of the terminal 131A from the first insulating layer 12. The second insulating layer 14 is made of resin. Examples of the resin include polyimide, maleimide, epoxy resin, polybenzoxazole, and polyester. The second insulating layer 14 covers at least a part of the peripheral edge portion E of the terminal 131A. In detail, the second insulating layer 14 has a first portion 14A and a second portion 14B.

The first portion 14A is disposed on the first insulating layer 12 in the thickness direction.

The second portion 14B is disposed on the peripheral edge portion E of the terminal 131A in the thickness direction. The second portion 14B is continuous to the first portion 14A. The second portion 14B covers at least a part of the peripheral edge portion E. The second portion 14B does not cover the second conductive layer 13B, but covers at least a part of the peripheral edge portion E of the first conductive layer 13A. In the present embodiment, as illustrated in FIG. 1, the second portion 14B covers the peripheral edge portion E on the entire periphery of the terminal 131A.

Further, as illustrated in FIG. 2, the second portion 14B is thinner than the second conductive layer 13B. In this manner, as described above, the terminal 131A protrudes toward one side in the thickness direction as compared with the second insulating layer 14.

The second insulating layer 14 covers at least a part of the peripheral edge portion E of each of the terminals 131B, 132A, and 132B, and also covers the wires 133A and 133B.

2. Method of Producing Wiring Circuit Board

Next, with reference to FIGS. 3A to 3E, a method of producing the wiring circuit board 1 is described.

The method of producing the wiring circuit board 1 includes a step of preparing the metal supporting layer 11 (see FIG. 3A), a step of forming the first insulating layer 12 (see FIG. 3B), a step of forming the first conductive layer 13A (see FIG. 3C), a step of forming the second conductive layer 13B (see FIG. 3D), a step of forming the second insulating layer 14 (see FIG. 3E), and a step of forming the protective layer 13C (see FIG. 2).

Figure 3A:
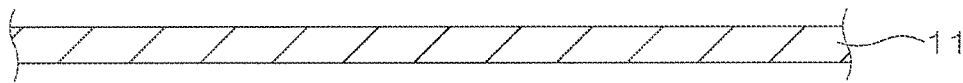
FIGS. 3A to 3E are views for explaining the steps of producing the wiring circuit board illustrated in FIG. 1.

To produce the wiring circuit board 1, as shown in FIG. 3A, first, metal foil is pulled out of a roll of metal foil, and then the pulled-out metal foil is prepared as the metal supporting layer 11.

Figure 3B:
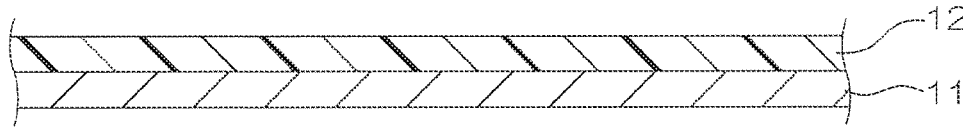

Next, as illustrated in FIG. 3B, in the second step, the first insulating layer 12 is formed on the metal supporting layer 11.

To form the first insulating layer 12, first, a solution (varnish) of photosensitive resin is applied on the metal supporting layer 11 and dried to form a coating film of the photosensitive resin. Next, the photosensitive resin coating film is exposed and developed, and, if necessary, cured by heating. In this manner, the first insulating layer 12 is formed on the metal supporting layer 11.

Figure 3C:
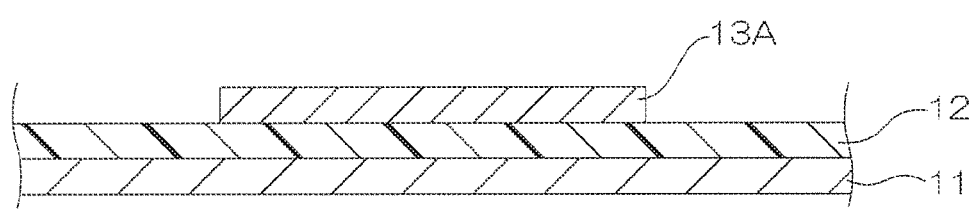

Next, as illustrated in FIG. 3C, in the third step, the first conductive layer 13A is formed on the first insulating layer 12.

To form the first conductive layer 13A, first, a seed layer is formed on a surface of the first insulating layer 12. The seed layer is formed, for example, by sputtering. Examples of the material of the seed layer include chromium, copper, nickel, titanium, and alloys thereof.

Next, a plating resist is attached on the first insulating layer 12 on which the seed layer has been formed. The plating resist is exposed while the part on which the first conductive layer 13A is to be formed is shielded from the light.

Next, the exposed plating resist is developed. This development removes the plating resist from the shielded part, and the seed layer is exposed in the part on which the first conductive layer 13A is to be formed. The plating resist remains in the exposed part, i.e., the part on which the first conductive layer 13A is not to be formed.

Next, the first conductive layer 13A is formed on the exposed seed layer by electrolytic plating.

After the completion of the electrolytic plating, the plating resist is released.

Figure 3D:
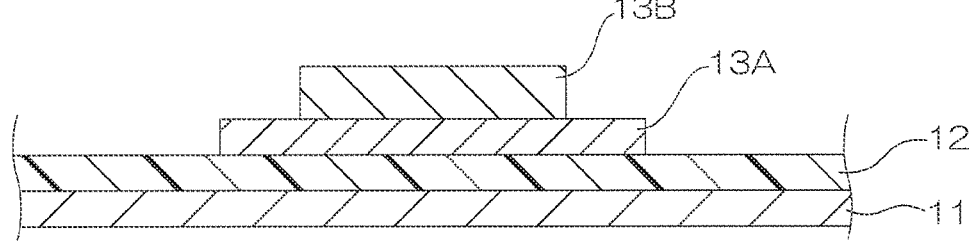

Next, as illustrated in FIG. 3D, in the fourth step, the second conductive layer 13B is formed on the first conductive layer 13A.

To form the second conductive layer 13B, first, a plating resist is attached on the first insulating layer 12 so as to cover the first conductive layer 13A. Then, while the part on which the second conductive layer 13B is to be formed is shielded from the light, the plating resist is exposed.

Next, the exposed plating resist is developed. This development removes the plating resist from the shielded part. The first conductive layer 13A is exposed in the part on which the second conductive layer 13B is to be formed. The plating resist remains in the exposed part, i.e., the part on which the second conductive layer 13B is not to be formed.

Next, the second conductive layer 13B is formed on the exposed first conductive layer 13A, by electrolytic plating.

After the completion of the electrolytic plating, the plating resist is removed.

Thereafter, the seed layer exposed by the release of the plating resist is removed by etching.

Figure 3E:
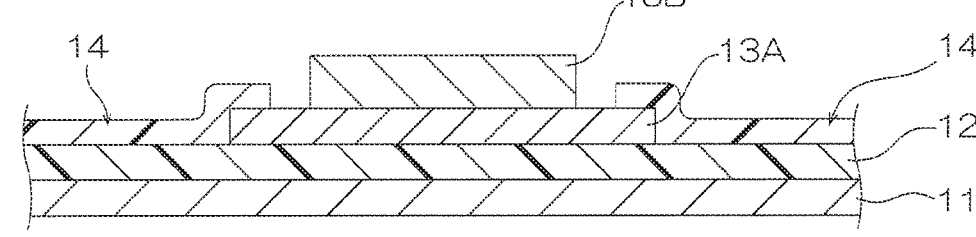

Next, as illustrated in FIG. 3E, in the fifth step, in the same manner as the formation of the first insulating layer 12, the second insulating layer 14 is formed on the first insulating layer 12, the peripheral edge portion E of each of the terminals 131A, 131B, 132A, and 132B, and the wires 133A and 133B.

Next, as illustrated in FIG. 2, the protective layer 13C is formed on the part of the terminal 131A that is exposed from the second insulating layer 14, by electroless plating or electrolytic plating.

3. Operations and Effects (1) In the wiring circuit board 1, as illustrated in FIG. 2, the second portion 14B of the second insulating layer 14 covers the peripheral edge portion E of the terminal 131A.

Thus, the second portion 14B of the second insulating layer 14 can suppress the release of the terminal 131A from the first insulating layer 12.

(2) In the wiring circuit board 1, as illustrated in FIG. 2, the terminal 131A is made of a plurality of conductive layers (the first conductive layer 13A and the second conductive layer 13B).

Thus, as compared with a structure in which the terminal 131A is made of one conductive layer, the terminal 131A is thick and heavy.

Therefore, as compared with a structure in which the terminal 131A is made of one conductive layer, the terminal 131A may easily be released from the first insulating layer 12.

In light of the above point, covering the peripheral edge portion E of the terminal 131A with the second portion 14B of the second insulating layer 14 can suppress the release of the terminal 131A from the first insulating layer 12 even when the terminal 131A is made of a plurality of conductive layers.

(3) In the wiring circuit board 1, as illustrated in FIG. 2, the first conductive layer 13A has the peripheral edge portion E. The second insulating layer 14 does not cover the second conductive layer 13B, but covers the peripheral edge portion E of the first conductive layer 13A.

Thus, while the terminal 131A is easily connected to an electronic appliance at the second conductive layer 13B that is not covered with the second insulating layer 14, the release of the terminal 131A from the first insulating layer 12 can be suppressed by covering the peripheral edge portion E of the first conductive layer 13A with the second insulating layer 14.

(4) In the wiring circuit board 1, as illustrated in FIG. 2, the terminal 131A protrudes toward one side in the thickness direction as compared with the second insulating layer 14.

Thus, while the release of the terminal 131A from the first insulating layer 12 can be suppressed, the terminal 131A is easily connected to an electronic appliance.

(5) In the wiring circuit board 1, as illustrated in FIG. 2, the second conductive layer 13B is thicker than the first conductive layer 13A.

Thus, the second conductive layer 13B secures a thickness of the terminal 131A.

(6) In the wiring circuit board 1, as illustrated in FIG. 1, the second portion 14B covers the peripheral edge portion E on the entire periphery of the terminal 131A.

Thus, the release of the terminal 131A from the first insulating layer 12 can further be suppressed.

(7) The wiring circuit board 1, as illustrated in FIG. 2, includes the metal supporting layer 11 disposed on the other side of the first insulating layer 12 in the thickness direction.

Thus, a stiffness of the wiring circuit board 1 can be secured with the metal supporting layer 11.

4. Variations

Next, with reference to FIGS. 4A to 8, variations are described. In each of the variations, the same members as in the above-described embodiment are given the same reference numerals, and the detailed descriptions thereof are omitted.

Figure 4A:
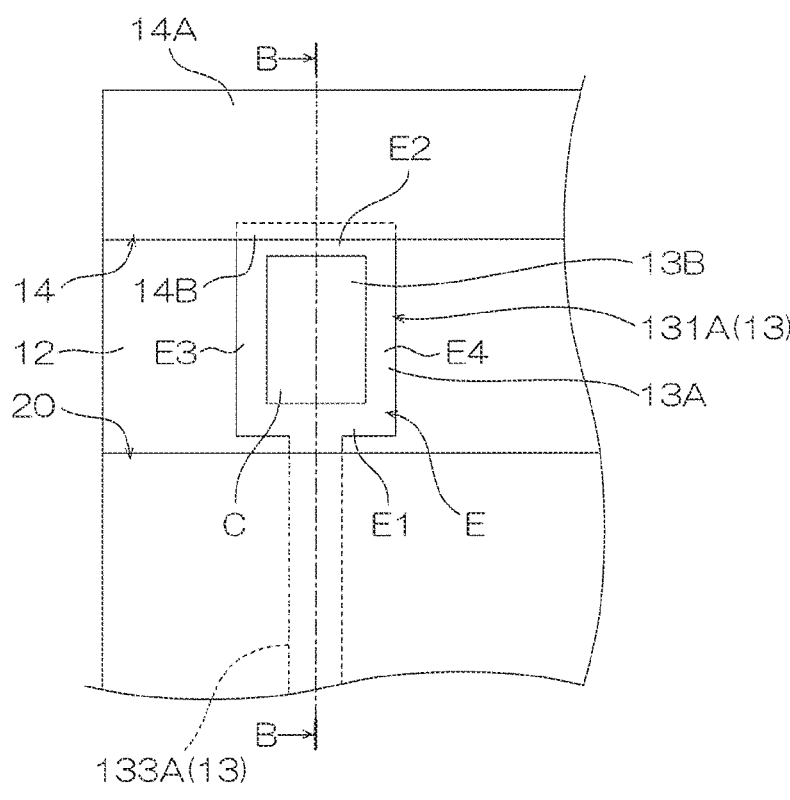
FIG. 4A illustrates a variation in which the second insulating layer does not cover the first peripheral edge portion, the third peripheral edge portion, and the fourth peripheral edge portion, but covers the second peripheral edge portion.
Figure 4B:
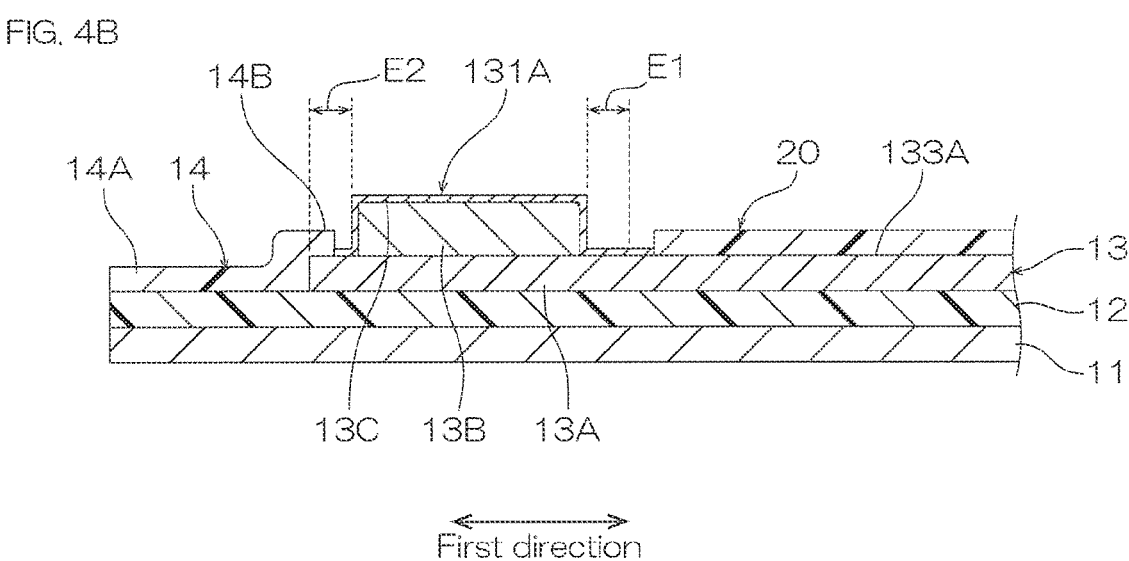
FIG. 4B is a cross-sectional view, taken along line B-B of FIG. 4A.

(1) As illustrated in FIGS. 4A and 4B, the second insulating layer 14 may not cover the peripheral edge portion E on the entire periphery of the terminal 131A. The second insulating layer 14 may cover a part of the peripheral edge portion E.

In detail, the peripheral edge portion E includes a first peripheral edge portion E1, a second peripheral edge portion E2, a third peripheral edge portion E3, and a fourth peripheral edge portion E4.

The first peripheral edge portion E1 is disposed in the other edge portion of the terminal 131A in the first direction. The first peripheral edge portion E1 is disposed at the other side of the connecting portion C of the terminal 131A in the first direction. The first peripheral edge portion E1 is connected with the wire 133A. The first peripheral edge portion E1 extends in the second direction.

The second peripheral edge portion E2 is disposed in one edge portion of the terminal 131A in the first direction. The second peripheral edge portion E2 is disposed at one side of the connecting portion C of the terminal 131A in the first direction. The second peripheral edge portion E2 is disposed away from the first peripheral edge portion E1 in the first direction. The second peripheral edge portion E2 is disposed at a side opposite to the wire 133A relative to the first peripheral edge portion E1 in the first direction. The second peripheral edge portion E2 extends in the second direction.

The third peripheral edge portion E3 is disposed in the one edge portion of the terminal 131A in the second direction. The third peripheral edge portion E3 is disposed at one side of the connecting portion C of the terminal 131A in the second direction. The third peripheral edge portion E3 is disposed between the first peripheral edge portion E1 and the second peripheral edge portion E2 in the first direction. The third peripheral edge portion E3 extends in the first direction. One edge portion of the third peripheral edge portion E3 in the first direction is connected with the one edge portion of the second peripheral edge portion E2 in the second direction. The other edge portion of the third peripheral edge portion E3 in the first direction is connected with the one edge portion of the first peripheral edge portion E1 in the second direction.

The fourth peripheral edge portion E4 is disposed in the other edge portion of the terminal 131A in the second direction. The fourth peripheral edge portion E4 is disposed at the other side of the connecting portion C of the terminal 131A in the second direction. The fourth peripheral edge portion E4 is disposed between the first peripheral edge portion E1 and the second peripheral edge portion E2 in the first direction. The fourth peripheral edge portion E4 extends in the first direction. One edge portion of the fourth peripheral edge portion E4 in the first direction is connected with the other edge portion of the second peripheral edge portion E2 in the second direction. The other edge portion of the fourth peripheral edge portion E4 in the first direction is connected with the other edge portion of the first peripheral edge portion E1 in the second direction.

The second portion 14B of the second insulating layer 14 does not cover the first peripheral edge portion E1, but covers the second peripheral edge portion E2. In this case, the second insulating layer 14 may not cover the wires 133A and 133B. The wiring circuit board 1 may include a third insulating layer 20 that covers the wires 133A and 133B. The third insulating layer 20 is disposed away from the second insulating layer 14. The third insulating layer 20 may be formed together with the second insulating layer 14 in the step of forming the second insulating layer 14 (see FIG. 3E).

Figure 5A:
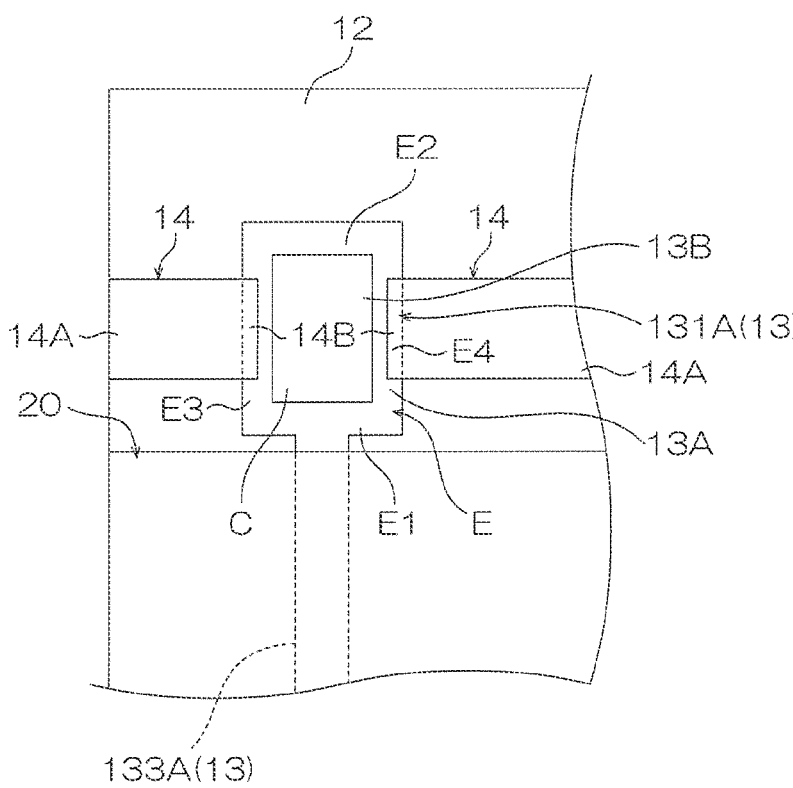
FIG. 5A illustrates a variation in which the second insulating layer does not cover the first peripheral edge portion and the second peripheral edge portion, but covers the third peripheral edge portion and the fourth peripheral edge portion.

Further, as illustrated in FIG. 5A, second insulating layers 14 may be disposed at one side of the connecting portion C of the terminal 131A and the other side of the connecting portion C of the terminal 131A one by one in the second direction. The second insulating layer 14 disposed at one side of the connecting portion C of the terminal 131A in the second direction covers the third peripheral edge portion E3. The second insulating layer 14 disposed at the other side of the connecting portion C of the terminal 131A in the second direction covers the fourth peripheral edge portion E4.

Figure 5B:
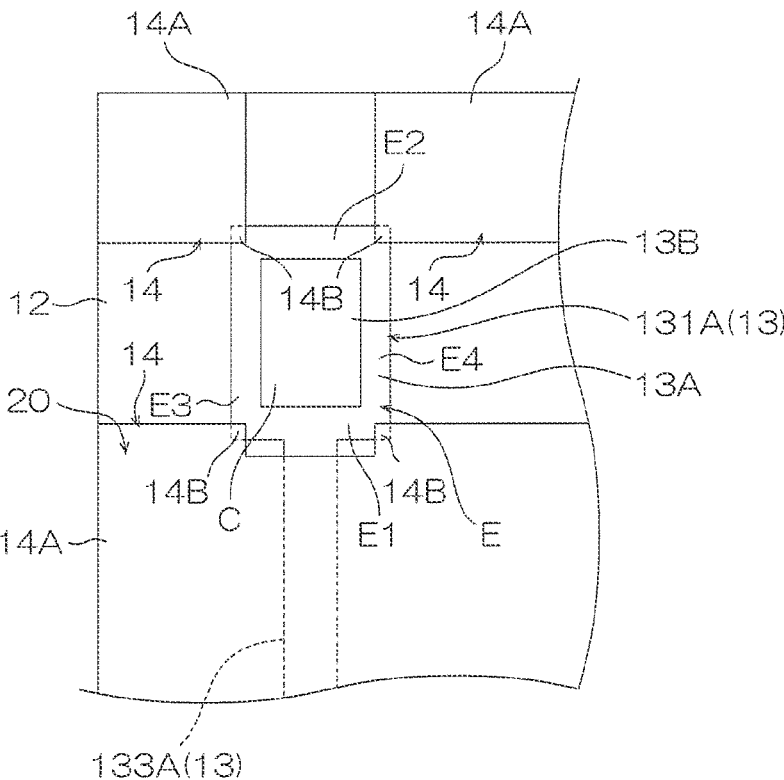
FIG. 5B illustrates a variation in which the second insulating layer covers the corners of the peripheral edge portions.

Further, as illustrated in FIG. 5B, the second insulating layers 14 may cover the peripheral edge portion E on the corners of the terminal 131A.

Figure 6A:
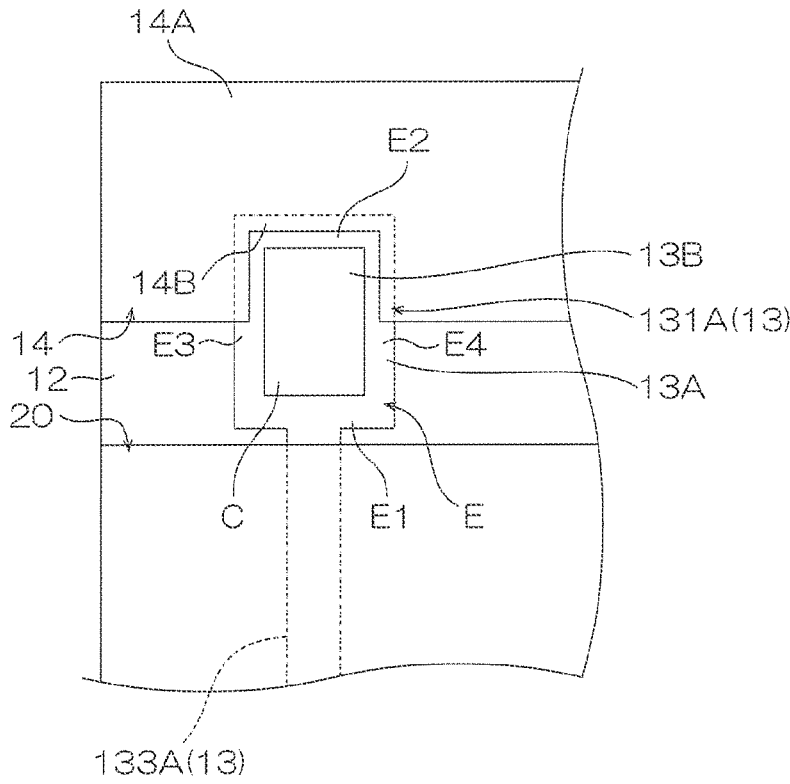
FIG. 6A illustrates a variation in which the second insulating layer does not cover the first peripheral edge portion, but covers the second peripheral edge portion, the third peripheral edge portion, and the fourth peripheral edge portion.

Further, as illustrated in FIG. 6A, the second insulating layer 14 may not cover the first peripheral edge portion E1, but cover the second peripheral edge portion E2, the third peripheral edge portion E3, and the fourth peripheral edge portion E4.

Figure 6B:
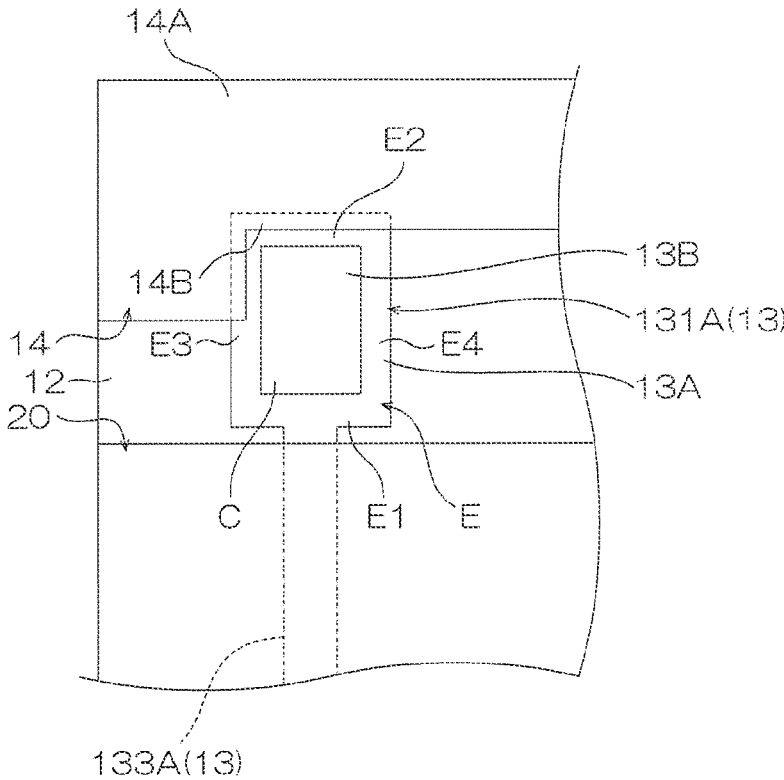
FIG. 6B illustrates a variation in which the second insulating layer does not cover the first peripheral edge portion and the fourth peripheral edge portion, but covers the second peripheral edge portion and the third peripheral edge portion.

Further, as illustrated in FIG. 6B, the second insulating layer 14 may not cover the first peripheral edge portion E1 and the fourth peripheral edge portion E4, but cover the second peripheral edge portion E2 and the third peripheral edge portion E3. Furthermore, the second insulating layer 14 may not cover the first peripheral edge portion E1 and the third peripheral edge portion E3, but cover the second peripheral edge portion E2 and the fourth peripheral edge portion E4.

With the variations illustrated in FIGS. 4A to 6B, the release of the terminal 131A from the first insulating layer 12 is efficiently suppressed with the small second insulating layer 14.

Figure 7A:
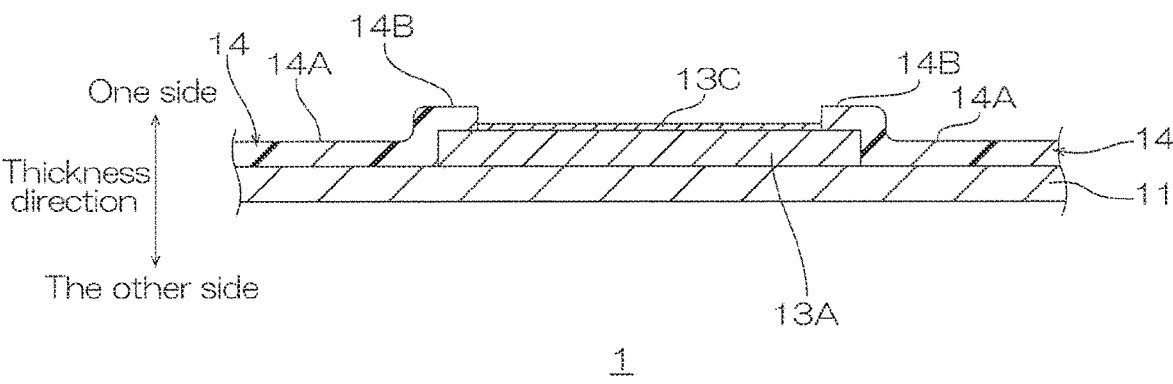
FIG. 7A illustrates a variation in which the terminal does not include the second conductive layer, but consists of the first conductive layer and a protective layer.

(2) As illustrated in FIG. 7A, the terminal 131A does not include a second conductive layer 13B, but is made of a first conductive layer 13A and a protective layer 13C.

Figure 7B:
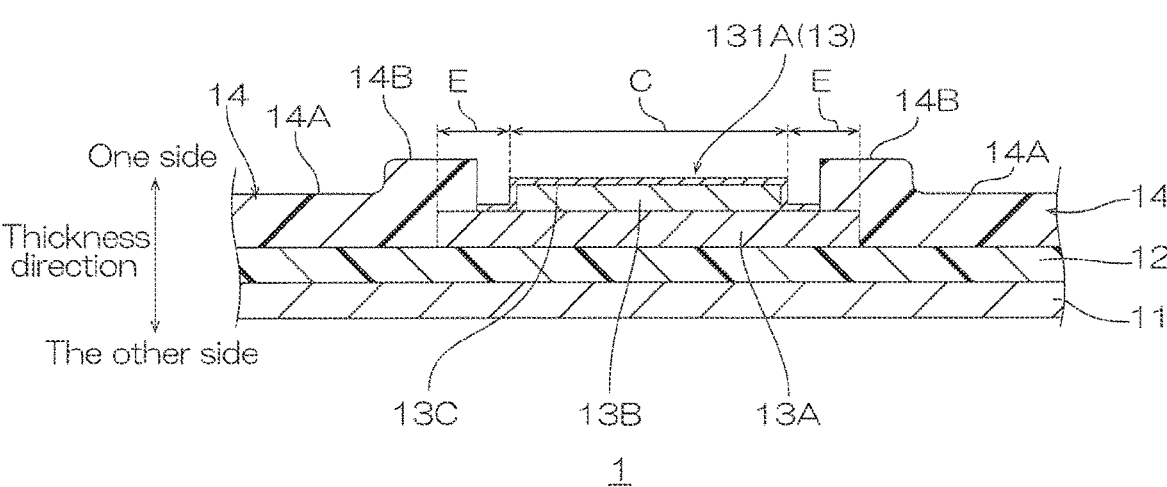
FIG. 7B illustrates a variation in which the second portion of the second insulating layer is thicker than the second conductive layer of the terminal.

(3) As illustrated in FIG. 7B, the second portion 14B of the second insulating layer 14 may be thicker than the second conductive layer 13B of the terminal 131A.

Figure 8:
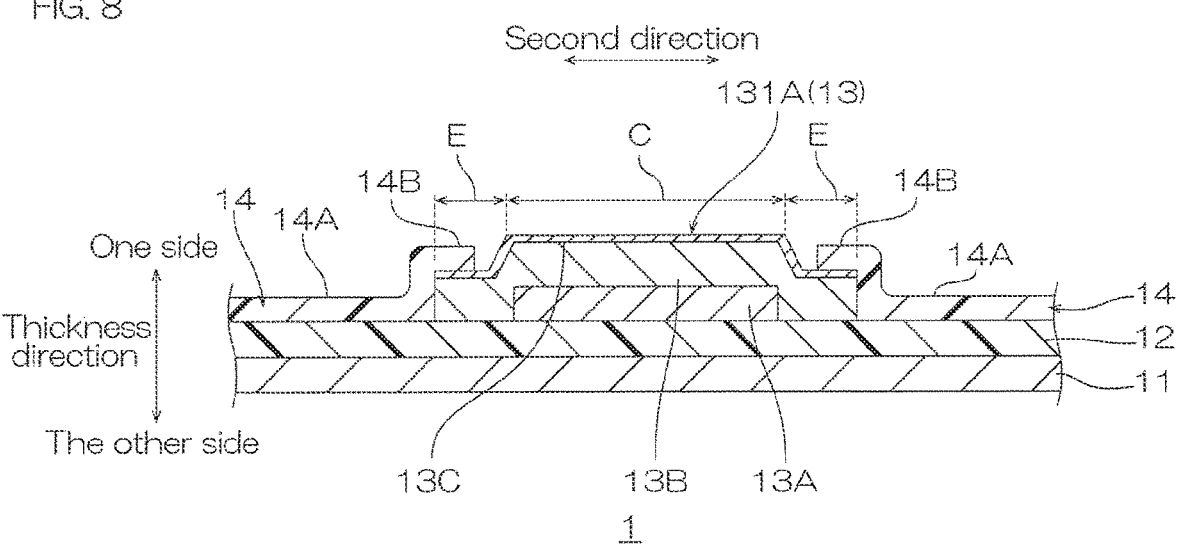
FIG. 8 illustrates a variation in which the second conductive layer has a peripheral edge portion.

(4) As illustrated in FIG. 8, the second conductive layer 13B may have a peripheral edge portion E. In detail, the peripheral edge portion E of the second conductive layer 13B is disposed outside the edge of the first conductive layer 13A in the first direction and the second direction. In this case, both side surfaces of the first conductive layer 13A in the first direction and at least a part of both side surfaces of the first conductive layer 13A in the second direction are covered with the second conductive layer 13B. Further, the second portion 14B of the second insulating layer 14 covers the peripheral edge portion E of the second conductive layer 13B.

In this variation, the second conductive layer 13B disposed at one side of the first conductive layer 13A forms the peripheral edge portion E of the terminal 131A.

This formation enables the second conductive layer 13B to cover the first conductive layer 13A, and further the second insulating layer 14 to cover the peripheral edge portion E of the second conductive layer 13B.

As a result, not only the release of the terminal 131A from the first insulating layer 12 but also the release of the second conductive layer 13B from the first conductive layer 13A can be suppressed.

While the illustrative embodiments of the present invention are provided in the above description, such is for illustrative purpose only and it is not to be construed as limiting in any manner. Modification and variation of the present invention that will be obvious to those skilled in the art is to be covered by the following claims.

DESCRIPTION OF REFERENCE NUMERALS 1 wiring circuit board
11 metal supporting layer
12 first insulating layer
13 conductive pattern
13A first conductive layer
13B second conductive layer
14 second insulating layer
14A first portion 14B second portion
131A terminal
133A wire
E peripheral edge portion
E1 first peripheral edge portion
E2 second peripheral edge portion

The invention claimed is:

1. A wiring circuit board comprising:
a first insulating layer;
a conductive pattern disposed at one side of the first insulating layer in a thickness direction and having a terminal and a wire connected with the terminal; and
a second insulating layer for suppressing release of the terminal from the first insulating layer, the second insulating layer having a first portion disposed at the one side of the first insulating layer in the thickness direction and a second portion disposed at the one side of a peripheral edge portion of the terminal in the thickness direction and covering the peripheral edge portion,
wherein the terminal has
a connecting portion disposed in a central part of the terminal and surrounded by the peripheral edge portion, the connecting portion in which the second insulating layer is not disposed.

2. The wiring circuit board according to claim 1,
wherein the terminal includes:
a first conductive layer disposed at the one side of the first insulating layer in the thickness direction; and
a second conductive layer made of a material identical to a material of the first conductive layer and disposed at the one side of the first insulating layer in the thickness direction.

3. The wiring circuit board according to claim 2,
wherein the first conductive layer has the peripheral edge portion,
wherein the peripheral edge portion is disposed outside an edge of the second conductive layer in a direction orthogonal to the thickness direction, and wherein the second portion of the second insulating layer does not cover the second conductive layer, but covers the peripheral edge portion of the first conductive layer.

4. The wiring circuit board according to claim 2,
wherein the second conductive layer has the peripheral edge portion,
wherein the peripheral edge portion is disposed outside an edge of the first conductive layer in a direction orthogonal to the thickness direction, and
wherein the second portion of the second insulating layer covers the peripheral edge portion of the second conductive layer.

5. The wiring circuit board according to claim 2,
wherein the terminal protrudes toward the one side in the thickness direction as compared with the second insulating layer.

6. The wiring circuit board according to claim 2,
wherein the second conductive layer is thicker than the first conductive layer.

7. The wiring circuit board according to claim 1,
wherein the second portion of the second insulating layer covers the peripheral edge portion on an entire periphery of the terminal.

8. The wiring circuit board according to claim 1,
wherein the peripheral edge portion has:
a first peripheral edge portion connected with the wire; and
a second peripheral edge portion disposed at a side opposite to the wire relative to the first peripheral edge portion in a first direction orthogonal to the thickness direction, and
wherein the second portion of the second insulating layer does not cover the first peripheral edge portion, but covers the second peripheral edge portion.

9. The wiring circuit board according to claim 1, further comprising a metal supporting layer disposed at the other side of the first insulating layer in the thickness direction.

* * * * *